(12) United States Patent
Kohiki et al.

(10) Patent No.: US 8,568,899 B2
(45) Date of Patent: *Oct. 29, 2013

(54) METAL COVERED POLYIMIDE COMPOSITE, PROCESS FOR PRODUCING THE COMPOSITE, AND PROCESS FOR PRODUCING ELECTRONIC CIRCUIT BOARD

(75) Inventors: Michiya Kohiki, Ibaraki (JP); Naonori Michishita, Ibaraki (JP); Nobuhito Makino, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/738,098

(22) PCT Filed: Sep. 16, 2008

(86) PCT No.: PCT/JP2008/066645
§ 371 (c)(1),
(2), (4) Date: Apr. 15, 2010

(87) PCT Pub. No.: WO2009/050971
PCT Pub. Date: Apr. 23, 2009

(65) Prior Publication Data
US 2010/0221563 A1  Sep. 2, 2010

(30) Foreign Application Priority Data

Oct. 18, 2007 (JP) ................. 2007-270935

(51) Int. Cl.
| B32B 15/04 | (2006.01) |
| B32B 15/08 | (2006.01) |
| B32B 15/20 | (2006.01) |
| B05D 1/18 | (2006.01) |
| C23C 14/18 | (2006.01) |
| C23C 14/20 | (2006.01) |
| C23C 28/02 | (2006.01) |
| C25D 5/10 | (2006.01) |
| C25D 5/56 | (2006.01) |
| C25D 5/48 | (2006.01) |

(52) U.S. Cl.
USPC ........... 428/626; 428/666; 428/674; 428/675; 428/336; 428/458; 216/13; 427/436; 427/437; 427/404; 427/294; 427/250; 205/187; 205/165; 205/183; 205/166; 205/186; 205/143; 205/170; 205/182; 205/223; 205/239

(58) Field of Classification Search
USPC .............. 428/473.5, 626, 666, 678, 679, 680, 428/674, 675, 610, 612, 458, 934, 935, 936, 428/937, 938, 336
See application file for complete search history.

(56) References Cited

U.S. PATENT DOCUMENTS

| 6,171,714 B1 | 1/2001 | Bergkessel et al. |
| 6,638,642 B2 | 10/2003 | Kitano et al. |

(Continued)

FOREIGN PATENT DOCUMENTS

| JP | 06-120630 A | 4/1994 |
| JP | 06-210794 A | 8/1994 |
| JP | 2000-054188 A | 2/2000 |

(Continued)

OTHER PUBLICATIONS

Machine Translation, Hamamura et al., JP 2006-316327, Nov. 2006.*

*Primary Examiner* — Michael La Villa
(74) *Attorney, Agent, or Firm* — Howson & Howson LLP

(57) ABSTRACT

Provided is a metal covered polyimide composite comprising a tie-coat layer and a metal seed layer formed on a surface of a polyimide film by electroless plating or a drying method, and a copper layer or a copper alloy layer formed thereon by electroplating, wherein the copper plated layer or copper alloy plated layer comprises three layers to one layer of the copper layer or copper alloy layer, and there is a concentrated portion of impurities at the boundary of the copper layer or copper alloy layer when the copper layer or copper alloy layer is three layers to two layers, and there is no concentrated portion of impurities when the copper layer or copper alloy layer is a single layer. Additionally provided are a method of producing the composite and a method of producing an electronic circuit board.

18 Claims, 11 Drawing Sheets

(56) References Cited

U.S. PATENT DOCUMENTS

| | | |
|---|---|---|
| 6,833,198 B2 | 12/2004 | Sakamoto et al. |
| 6,835,241 B2 | 12/2004 | Tsuchida et al. |
| 6,960,391 B2 | 11/2005 | Natsume et al. |
| 7,341,796 B2 | 3/2008 | Hanafusa |
| 2002/0182432 A1 | 12/2002 | Sakamoto et al. |
| 2004/0209109 A1 | 10/2004 | Tsuchida et al. |
| 2007/0145584 A1 | 6/2007 | Kataoka et al. |
| 2009/0162685 A1 | 6/2009 | Kobayashi et al. |
| 2009/0208762 A1 | 8/2009 | Akase |
| 2010/0018273 A1 | 1/2010 | Sato |
| 2010/0040873 A1 | 2/2010 | Kohiki et al. |
| 2010/0051451 A1 | 3/2010 | Sato |
| 2010/0215982 A1* | 8/2010 | Kohiki et al. ............. 428/666 |

FOREIGN PATENT DOCUMENTS

| | | | |
|---|---|---|---|
| JP | 2002-252257 A | | 9/2002 |
| JP | 2006-316327 | * | 11/2006 |
| JP | 2007-204848 A | | 8/2007 |
| JP | 2007-214519 A | | 8/2007 |
| JP | 2007-246962 A | | 9/2007 |
| WO | WO 2006/059825 | * | 6/2006 |

* cited by examiner

METAL COVERED POLYIMIDE COMPOSITE, PROCESS FOR PRODUCING THE COMPOSITE, AND PROCESS FOR PRODUCING ELECTRONIC CIRCUIT BOARD

BACKGROUND OF THE INVENTION

The present invention relates to a metal covered polyimide composite for use as a mounting material of electronic components such as a flexible print substrate, TAB and COF (Chip on Film), and additionally relates to a process for producing the composite and a process for producing an electronic circuit board.

An FCCL (Flexible Copper Clad Laminate), in which metal conductor layers primarily formed from copper are laminated on a polyimide film, is broadly used as a circuit board material in the electronics industry. Among the above, a non-adhesive flexible laminate (especially a two-layer flexible laminate) that does not include an adhesive layer between a polyimide film and a metal layer is catching attention on the demands of finer pitches of the circuit wiring width.

As a method of producing a non-adhesive flexible laminate; in particular a non-adhesive flexible laminate capable of accommodating fine pitches, primarily performed is a so-called metalizing method of forming, in advance, a tie-coat layer configured from a material having favorable adhesion with polyimide on a polyimide film by a drying method such as sputtering, CVD, or vapor deposition and a metal seed layer as a conductor of the cathode/current in the subsequent electroplating process, and thereafter forming a metal layer film to become the conductor layer of the circuit board by way of electroplating (refer to Patent Literature 1).

In this metalizing method, for better adhesion strength between the metal layer and the polyimide film, modification is carried out by performing plasma treatment to the polyimide film surface to eliminate the contaminants on the surface and to improve the surface roughness prior to forming the metal layer (refer to Patent Literature 2 and Patent Literature 3).

Generally, when pre-forming a metal layer on a polyimide film by a drying method such as sputtering, the improvement of adhesion and etching properties is being sought through the selection of the interlayer material (refer to Patent Literature 4).

In addition, proposed is a polyimide film with a metal film for use in TAB or FPC obtained by performing chemical etching to the polyimide film surface so to roughen the surface, forming a foundation layer thereon, and additionally forming a copper vapor deposition layer thereon (refer to Patent Literature 5).

When a metal covered polyimide composite is to be used as a mounting material of electronic components such as a COF (Chip on Film), the metal layer on the polyimide is partially eliminated to create a circuit pattern, tin plating is subsequently performed on the copper layer forming the circuit pattern, and treatment such as solder resist or resin seal is additionally performed on the tin plated layer. However, a problem in that this tin plated layer may peel occurs. A major cause of such peeling is the Kirkendall voids (air gaps) generated between the copper layer and the tin plated layer due to the electroplating process. The Kirkendall voids will be explained in detail later.

An electroplated copper layer is usually formed with a plurality of electrolytic baths, and the electroplating current conditions of the copper layer will change considerably among the electrolytic baths as a matter of course. The portions in which the electroplating current conditions change considerably will become copper plated layer boundaries where impurities will increase and be concentrated easily. Since the Kirkendall voids particularly occur at the portions where the copper plated layer boundary and the tin plated layer are adjacent to each other, if plating is to be performed in multiple electroplating baths, then the Kirkendall voids will arise at least in a quantity that is equivalent to the number of electroplating baths.

As a method of overcoming the foregoing problem, proposed is a method of forming a copper layer from the surface layer to an area that is at least three times the tin plated layer using the same electrolytic bath in a copper plating film to be formed using a plurality of electrolytic baths (refer to Patent Literature 6). Patent Literature 6 has analized that the Kirkendall voids causes the peeling.

Nevertheless, in the foregoing case, Patent Literature 6 only sees the tin covered on the uppermost layer of the copper plating as the problem. However, when forming a copper circuit and covering it with a tin layer, the tin layer will be deposited on the side face in addition to the uppermost layer of the copper. In addition, as described later, since a copper layer boundary may occur even with the same electrolytic bath, it cannot be said that the foregoing method is a sufficient solution to the problem.

Accordingly, the problem of Kirkendall voids arising in the bonded interface of the multiple copper layers (nine layers in the Examples of Patent Literature 6) and the tin layer has not been resolved. In addition, with a copper layer in which only the uppermost layer is thick, the other copper layers must be made thin by just that much, and there is a problem in that the balance of the copper layers will be lost.

In light of the above, a zigzag-type electroplating process that requires numerous electroplating baths is undesirable, and it is preferable to reduce the number of electroplating baths as much as possible. In order to obtain a plated copper layer of the intended thickness with few electroplating baths, it is necessary to raise the plating current density, and in this respect a drum electroplating method is effective. The drum electroplating method is feeding a polyimide film, in which a tie-coat layer and a metal seed layer are formed thereon by electroless plating or a drying method, around a drum surface that is dipped in an electrolyzer, and thereby performing copper plating to the surface. Since this method enables to move the anode and cathode closer without having disturbances such as the warping or blurring during the feeding of the film to become the cathode and to control the distance constant between the anode and cathode, it is possible to increase the current density.

Moreover, as a result of moving the anode and cathode closer together, the flow velocity of the plating electrolytic solution can also be increased easily, and this is also effective in increasing the current density. Accordingly, the drum electroplating method is effective in preventing the increase and concentration of impurities, and thereby decreasing the incidental Kirkendall voids.

Nevertheless, this drum electroplating method also entails its own problems. It is necessary to increase the current density in order to increase the electrodeposition rate of the electroplating process. However, at the initial stage of starting the electroplating process, the metal seed layer formed on the polyimide surface is unable to withstand a large current since its thickness is limited. Consequently, the anodes set to face the drum are divided into a plurality of zones, and the current density to the respective zones is being controlled independently.

As a result, each time the amount of feed (amount of current) to the anode changes, a different copper plated layer is formed, and the impurities will increase and be concentrated at the copper plated layer boundary, whereby the Kirkendall voids will arise. Conventionally, in consideration of the production efficiency, a feeding method of disposing numerous anodes and dividing the zone into four zones or more is being adopted, and, as a result, the number of copper layers will be four or more.

In addition, when feeding the plating material around the drum and performing plating upon providing anodes at the opposing position, a proposal has been made of making the space between one anode and the plating drum to be different for each plating area, or disposing a differently sized mesh between the anode and the plating drum (refer to Patent Literature 7). It may appear that the increase of impurities and the generation of the Kirkendall voids can be inhibited by reducing the number of plating baths.

However, this idea is unrealistic since it merely proposes the use of one anode because the control of the current density for each anode is troublesome. In other words, besides the supply method being unclear, the flow velocity of the plating solution will be disturbed and it will not be possible to ensure a uniform flow velocity if mesh or the like is disposed. Specifically, with Patent Literature 1, mesh or the like will become an impediment whereby the flow velocity of the plating solution cannot be controlled, and it will be difficult to ensure the uniformity of the amount of electrodeposition in a direction that is parallel to the rotational axis of the drum. Aside from the problem of Kirkendall voids, this idea relates to the problem of plating uniformity, so it could be said that it is an unrealistic method. In addition, this technology fails to even recognize the problem of Kirkendall voids.

Accordingly, it could be said that the conventional technologies fail to teach a fundamental solution to the problem of Kirkendall voids that arise between the copper layer and the tin layer.

[Patent Literature]
1. JP Patent No. 3258296
2. JP Patent No. 3173511
3. PCT (WO) 2003-519901
4. Japanese Patent Laid-Open Publication No. H6-120630
5. Japanese Patent Laid-Open Publication No. H6-210794
6. Japanese Patent Laid-Open Publication No. 2007-214519
7. Japanese Patent Laid-Open Publication No. 2007-204848

SUMMARY OF THE INVENTION

Thus, an object of the present invention is to provide a metal covered polyimide composite which can effectively prevent peeling in a non-adhesive flexible laminate (especially a two-layer flexible laminate), and particularly can effectively inhibit peeling from the interface of a copper layer and tin plating, as well as provide a method of producing the composite and a method of producing an electronic circuit board.

In order to achieve the foregoing object, the present invention provides:

1) A metal covered polyimide composite comprising a tie-coat layer and a metal seed layer formed on a surface of a polyimide film by electroless plating or a drying method, and a copper layer or a copper alloy layer formed thereon by electroplating, wherein the copper plated layer or copper alloy plated layer comprises three layers to one layer of the copper layer or copper alloy layer, including a concentrated portion of impurities at the boundary of the copper layer or copper alloy layer when the copper layer or copper alloy layer is three layers to two layers, and no concentrated portion of impurities when the copper layer or copper alloy layer is a single layer; and 2) The metal covered polyimide composite according to paragraph 1) above, wherein the tie-coat layer is one type among nickel, chromium, cobalt, nickel alloy, chromium alloy, and cobalt alloy, and the metal seed layer is copper or copper alloy.

The present invention additionally provides:

3) A method of producing a metal covered polyimide composite, wherein after forming a tie-coat layer and a metal seed layer on a surface of a polyimide film by electroless plating or a drying method, three layers to one layer of an electroplated layer of copper or copper alloy are additionally formed thereon, wherein formed is a copper layer or copper alloy layer including a concentrated portion of impurities at the boundary of the copper layer or copper alloy layer when the copper layer or copper alloy layer is three layers to two layers, and no concentrated portion of impurities when the copper layer or copper alloy layer is a single layer.

The present invention further provides:

4) The method of producing a metal covered polyimide composite according to paragraph 3) above, wherein after forming a tie-coat layer and a metal seed layer on a surface of a polyimide film by electroless plating or a drying method, an electroplated layer formed of copper or copper alloy is formed by dividing an electroplating zone into one to four zones when feeding the polyimide film with the tie-coat layer and metal seed layer formed thereon around a plating drum and performing electroplating thereto;

5) The method of producing a metal covered polyimide composite according to paragraph 3) or paragraph 4) above, wherein the electroplating is performed in one or two baths; and 6) A method of producing an electronic circuit board, wherein after forming a copper circuit or copper alloy circuit by way of etching using the metal covered polyimide composite according to paragraph 1) or paragraph 2) above, tin plating to the copper circuit or copper alloy circuit is performed.

As a result of the above, a metal covered polyimide composite, a method of producing the composite and a method of producing an electronic circuit board of the present invention can effectively prevent peeling in a non-adhesive flexible laminate (especially a two-layer flexible laminate), particularly can effectively inhibit peeling from the interface of a copper layer and a tin plating, and yield a superior effect of being able to improve the adhesion strength.

Figure 1:
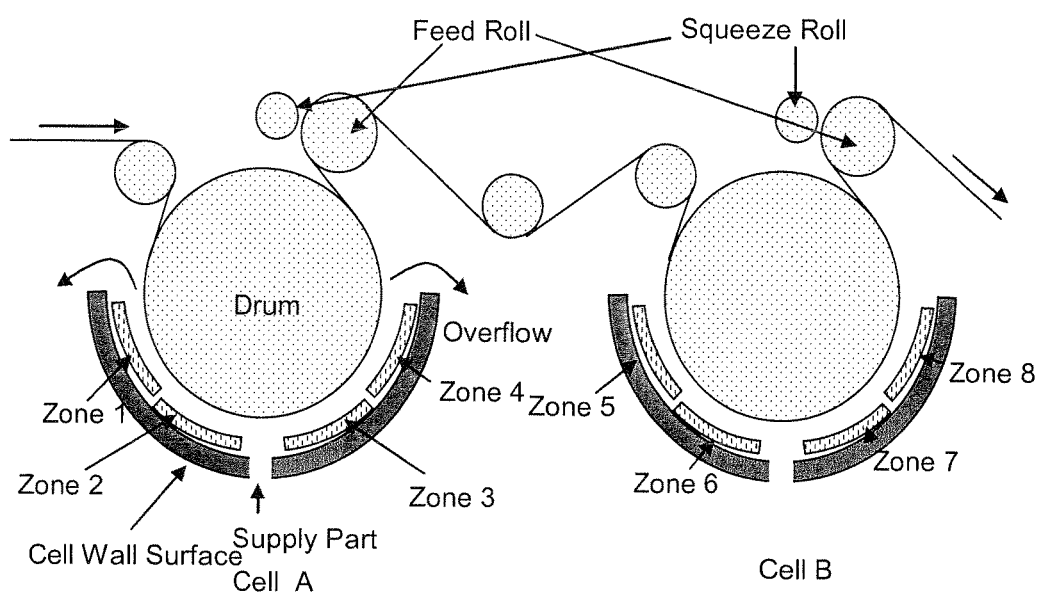
[FIG. 1]
A schematic explanatory diagram of a drum-based two bath-type electroplating apparatus.

A micrograph showing the cross section of a boundary obtained by forming a circuit by etching the two plated copper layers of Example 2, forming a tin plated layer on the copper circuit, and performing annealing after the tin plating.

[FIG. 6]

A micrograph of the copper foil cross section on the polyimide layer comprising the two copper layers shown in Example 3.

[FIG. 7]

A micrograph showing the cross section of a boundary obtained by forming a circuit by etching the two plated copper layers of Example 3, forming a tin plated layer on the copper circuit, and performing annealing after the tin plating.

[FIG. 8]

A micrograph of the copper foil cross section on the polyimide layer comprising the one copper layer shown in Example 4.

[FIG. 9]

A micrograph showing the cross section of a boundary obtained by forming a circuit by etching the one plated copper layer of Example 4, forming a tin plated layer on the copper circuit, and performing annealing after the tin plating.

[FIG. 10]

A micrograph of the cross section of the ten copper plated layers shown in Comparative Example 1.

[FIG. 11]

A micrograph showing the cross section of a boundary obtained by forming a circuit by etching the ten copper plated layers of Comparative Example 1, forming a tin plated layer on the copper circuit, and performing annealing after the tin plating.

[FIG. 12]

A diagram showing the analysis of impurities based on D-SIMS of a copper layer on the polyimide layer comprising the three copper layers (two boundary sections) shown in Example 1.

[FIG. 13]

A diagram showing the analysis of impurities based on D-SIMS of a copper layer on the polyimide layer comprising the two copper layers (one boundary section) shown in Example 2.

[FIG. 14]

A diagram showing the analysis of impurities based on D-SIMS of a copper layer on the polyimide layer comprising the two copper layers (one boundary section) shown in Example 3.

[FIG. 15]

A diagram showing the analysis of impurities based on D-SIMS of a copper layer on the polyimide layer comprising the copper layer (zero boundary sections) shown in Example 4.

[FIG. 16]

A diagram showing the analysis of impurities based on D-SIMS of a copper layer on the polyimide layer comprising the ten or more copper layers (ten or more boundary sections) shown in Comparative Example 1.

DETAILED DESCRIPTION OF THE INVENTION

Specific examples of the present invention are now explained. The ensuing explanation is provided to facilitate the understanding of this invention, and the present invention shall in no way be limited thereby. In other words, various modifications and other embodiments shall be included in the present invention as a matter of course.

Incidentally, the present invention includes cases of copper alloy plating in addition to copper plating, but in order to simplify the explanation these will be collectively explained as copper plating. Here, this shall also include copper alloy plating.

The basic process is to form a metal layer on at least one face of the polyimide film by the sputtering method, and additionally form a metal conductor layer formed from a copper layer or copper alloy layer on the foregoing surface in order to prepare a non-adhesive flexible laminate.

Foremost, the polyimide film surface is subject to plasma treatment in order to eliminate the contaminants on the surface and modify the surface.

Subsequently, a sputtered metal layer (so-called tie-coat layer) of 5 to 300 nm is formed on the surface of the polyimide film. Generally, the sputtered metal layer is selected one type among nickel, chromium, cobalt, nickel alloy, chromium alloy, and cobalt alloy. Generally speaking, a polyimide film having a thickness of 12.5 μm to 50 μm can be used, but this thickness is required to the circuit board, and there is no particular limitation regarding the thickness.

Generally, Upilex by Ube Industries, Kapton by DuPont-Toray, Apical by Kaneka or the like is used, but there is also no particular limitation regarding the type of polyimide film to be used.

The tie-coat layer has the function of increasing the adhesive strength between the metal layer and the polyimide [film], and increasing the stability under a heat-resistant and moisture-resistant environment.

Subsequently, a copper layer of 150 to 500 nm to become the metal seed layer is formed on the tie-coat layer by sputtering. The sputtered copper layer will become the conductor of the cathode/current in the subsequent electroplating process.

Subsequently, an electroplated layer formed from copper or copper alloy is formed on the metal seed layer. As the plating system, the electroplating apparatus shown in FIG. 1 is used.

This electroplating apparatus comprises an electroplating bath, a plating drum in which a part thereof (approximately half) is dipped in the electroplating bath, a unit for feeding a polyimide film to be plated around the plating drum, a unit for supplying current to the plated surface of the polyimide film, and one or more anodes facing the drum. As one mode, these anodes are so-called insoluble anodes, and the supply of copper ions for copper plating is performed by supplying an electrolytic solution, in which copper is separately dissolved and in which the copper concentration is adjusted, to the electrolytic bath.

The copper or copper alloy plating system that is used in the present invention is a one or two bath-type plating system. In the case of a two bath-type plating system, Cell A (a bath) has zones 1 to 4 and Cell B (the other bath) similarly has zones 5 to 8. It should be easy to understand that the one bath-type plating system only has Cell A. Conventionally, in order to value the plating efficiency, even in the case of using two baths, the number of zones was increased and four or more plated layers were used. Anodes are set to face the drum for each of these zones. The solution sending method where the electroplating solution is supplied from the lower part of the electroplating bath and overflows from the upper part of the electroplating bath is adopted. This supply method is able to control the flow velocity and is necessary to form a uniform plated layer. Moreover, the current of each anode zone can be adjusted independently.

At the initial stages of plating using the foregoing two bath-type plating system; that is, at zone 1 and zone 2, the copper or copper alloy plating to the sputtered metal layer is hardly performed, and only a slight amount of plating is formed. In addition, the same applies to Cell B, and the plating material that was once exposed to the atmosphere is hardly plated at first; that is, the plating is not formed even in the initial feeding at zones 5 and 6. Accordingly, with this kind of two bath-type electroplating apparatus, plating is performed at zones 3 and 4, and at zones 7 and 8.

Conventionally, a plating method of arranging numerous plating baths in parallel and repeatedly dipping a continuously wound polyimide film in a plating bath was adopted. In many cases, a copper plated layer was conventionally formed according to the foregoing method. Based on this method, since there is no limit in the number of plating baths, plating can be performed to multiple layers as many as plating baths.

With this kind of zigzag-type plating method, the retention time in each plating bath is short. Thus, in order to achieve a prescribed thickness, ten or more plated layers are usually formed (refer to foregoing Patent Literature 7).

With electronic components such as a COF (Chip on Film), the copper layer of the metal covered polyimide composite obtained as described above is etched with an etching solution to form a conductive circuit. Then, tin plating is formed on the copper circuit and solder resist, resin or the like is used additionally to cover the same. In the foregoing case, peeling between the copper circuit layer and tin plated layer and cracks in the tin layer will become a problem.

A major cause of these problems is considered to be the Kirkendall voids explained above. By observing the locations where peeling occurred between the copper circuit layer and tin plated layer, air gaps were observed. Since this tin layer is formed on the side face of the circuit in addition to the upper surface of the copper circuit, this is a problem that cannot be solved with only the upper surface of the copper circuit. Moreover, the generation of the Kirkendall voids is also considered to be cause of increase and concentration of impurities.

Since numerous crystal grain boundaries and impurities exist in the vicinity of the copper plated layer boundary, it is considered that the lattice arrangement of copper crystals is incomplete. Since such incomplete lattice arrangement will considerably accelerate the diffusion of copper, the diffusion rate of copper considerably exceeds that of tin in the mutual diffusion of copper and tin in the vicinity of the copper plated layer boundary and copper will be deficient in the vicinity of said boundary.

Thus, numerous atomic vacancies will arise in the vicinity of the copper plated layer boundary after the copper is diffused. These atomic vacancies are trapped in the portions where the lattice arrangement is incomplete in the vicinity of the copper plated layer boundary, and the air gaps assembled thereby are the Kirkendall voids. So, the generation of Kirkendall voids and the increase of impurities are not unrelated.

Although it is considered that the Kirkendall voids do not arise easily at room temperature, diffusion will advance due to the foregoing mechanism, and the Kirkendall voids are generated thereby during the heat treatment at roughly 80 to 150° C. after the tin plating, and the heat treatment at roughly 150 to 160° C. in the processes of solder resist, resin seal and the like. The foregoing heat treatment processes are indispensible in producing wiring boards, and it can be said that this is an unavoidable problem so long as discontinuous portions of the interface exists.

In fact, at the locations where the Kirkendall voids occur; that is, at the discontinuous plating boundary, a phenomenon has been observed where the existence of fine crystal grains and the concentration of C, O, S, Cl and H, which are considered to be due to the additives added during the plating process, are higher in comparison to the continuously plated portions, and this verifies the mechanism in which the Kirkendall voids are generated. Hardly any generation of the Kirkendall voids is acknowledged in the continuously plated section of the copper layer, which is described later.

The peeling between the copper circuit layer and tin plated layer and the generation of cracks in the tin layer are not caused only by the Kirkendall voids, but are considerably affected by the increase and concentration of impurities in the overall copper circuit layer. Hardly any impurities can be acknowledged in portions that were subject to uniform copper plating. Nevertheless, every time tin copper plating is repeated numerous times as described above and the number of copper plated layers increases, a boundary will appear between the layers, and C, O, S, Cl and H, which are considered to be caused by additives, will be concentrated as impurities at such boundary section.

With a conventional zigzag-type continuous copper plating process, since halfway plated layers will be exposed to the atmosphere numerous times (usually ten times or more), for instance, ten or more plated copper layers are formed, and a boundary section will appear between those layers, and oxygen in the air will adsorb to the plated layer in such boundary section, and impurities will increase even further.

Accordingly, reducing the copper plated layer boundaries as much as possible will enable to reduce the vulnerable sites as the copper plating boundary layers and to reduce the impurities in the overall copper plated layer. Consequently, it will be possible to inhibit the peeling more effectively between the copper circuit layer and the tin plated layer and the generation of cracks in the tin layer.

As described above, the fewer the number of copper layers, that is, the number of copper layer boundaries, the fewer the concentrated portions of impurities' and the Kirkendall voids. In connection with this, the overall amount of impurities also tends to decrease. In this respect, with the drum-based two-bath copper plating system, if a once-plated surface is exposed to the atmosphere and additionally plated again, a copper layer boundary (discontinuous layer) will be formed, and gas components such as oxygen in the air will be introduced. Thus, with a drum-based two-bath plating system, it is difficult to completely inhibit the Kirkendall voids.

Nevertheless, just because the impurities are concentrated or the Kirkendall voids are generated, it does not necessarily mean that they will all cause cracks in the tin layer or peeling, and what is important is how to reduce the amount of Kirkendall voids as much as possible upon efficiently forming a copper plated layer.

Moreover, with the foregoing zigzag-type plating system, since the concentrated portion of impurities and the Kirkendall voids will occur as many as, or more than the number of baths (ten layers or more), it could be said that this is clearly undesirable.

In light of the above, the present invention provides an apparatus for producing a metal covered polyimide composite in a drum plating system comprising an electroplating bath, a plating drum in which a part thereof (approximately half) is dipped in the electroplating bath, a unit for feeding a polyimide film to be plated around the plating drum, a unit for supplying current to the plated surface of the polyimide film, and one or more anodes facing the drum, wherein the plating zone is divided into three zones to one zone, and the copper layer or copper alloy layer is formed as three layers to one layer. The present invention additionally provides a method and apparatus for producing a metal covered polyimide composite in which the number of boundaries between the respective copper layers or copper alloy layers is two to zero.

Incidentally, in the foregoing case, in order to efficiently perform the plating, the distance L between zone 3 and zone 4 (or distance L between zone 7 and zone 8) is adjusted to be preferably double or less than the distance d between the anode and the plating object, and more preferably ½ or less.

Consequently, it is thereby possible to reduce the discontinuous interface of the tin-plated copper layer and the tin layer as much as possible, and inhibit the inclusion and concentration of impurities, as well as the generation of Kirkendall voids which are caused by such impurities. Thus, the present invention aims to reduce the impurities and inhibit the concentration of such impurities that are included in the copper, which is the underlying cause of the foregoing problems.

In addition, desirably, the number of copper or copper alloy electroplating baths is few as possible, which is because an unavoidable discontinuous interface will occur as described above. Thus, the use of one or two baths would be a desirable condition.

EXAMPLES

The Examples and Comparative Examples of the present invention are now explained. These Examples are merely illustrative, and the present invention shall in no way be limited thereby. In other words, various modifications and other embodiments based on the technical spirit claimed in the claims shall be included in the present invention as a matter of course.

Example 1

There is no particular limitation in the material used as the polyimide film. For instance, Upilex by Ube Industries, Kapton by DuPont-Toray, Apical by Kaneka are commercially available, and any one of these polyimide films can be applied in the present invention. The present invention is not limited to this kind of specific variety. In the Examples and Comparative Examples, Upilex-SGA by Ube Industries is used as the polyimide film.

Foremost, the polyimide film was placed in a vacuum apparatus and, after evacuation, the polyimide film was subject to surface modification treatment using plasma.

Next, a tie-coat layer (Ni-20 wt % Cr) of 25 nm was formed on the foregoing polyimide film surface subject to the plasma treatment by way of sputtering. Subsequently, a metal seed layer (copper layer) of 300 nm was formed by sputtering. This can also be formed by electroless plating, but sputtering was performed in the Examples.

Then, the drum-based two bath-type electroplating apparatus shown in FIG. 1 was used to form a metal conductor layer (total thickness of approximately 8 μm) formed of copper on the surface of the foregoing metal seed layer by way of electroplating using a copper sulfate plating bath, whereby a two-layer flexible laminate was prepared. In the foregoing case, in order to reduce the number of zones, in Cell A, the anodes in zone 3 and zone 4 were electrically connected, and the distance L between zone 3 and zone 4 was adjusted to be approximately ½ of the distance d between the anode and the plating object in order to form the copper plated layer.

As a result of forming the copper layer, as described above, only a slight plated layer was formed in zone 1 and zone 2 of Cell A. Moreover, no plated layer was formed in zone 5 and zone 6 of Cell B. The copper layer was mainly formed in zone 3+zone 4, zone 7, and zone 8. The results are shown in Table 1.

As shown in Table 1, a copper plated layer of 3.90 μm was formed in zone 3+zone 4, that of 2.07 μm in zone 7, and that of 2.20 μm in zone 8. By way of reference, a copper plated layer of 0.05 μm was formed in zone 1, that of 0.27 in zone 2, and that of 0 μm in zone 5 and zone 6 respectively.

TABLE 1

| Zone | 1 | 2 | 3 + 4 | 5 | 6 | 7 | 8 |
| --- | --- | --- | --- | --- | --- | --- | --- |
| Thickness | 0.05 | 0.27 | 3.90 | 0.00 | 0.00 | 2.07 | 2.20 |

Thickness: Plating thickness (μm) per zone

Figure 2:
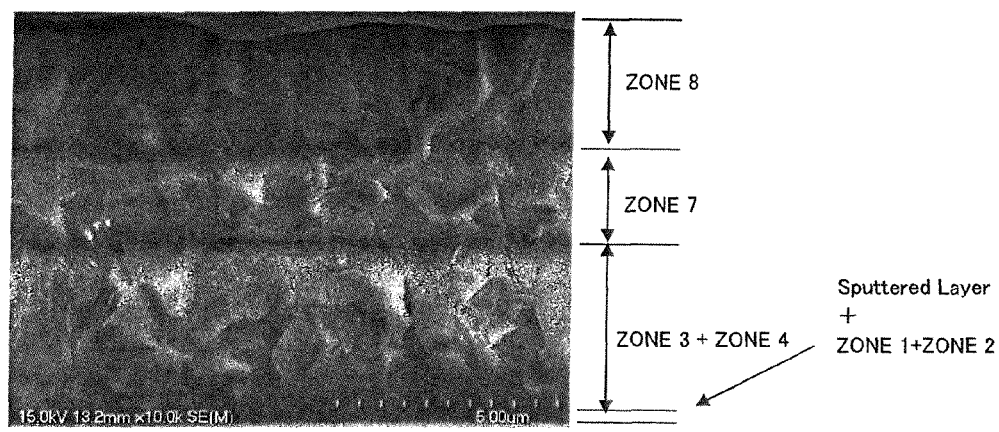
[FIG. 2]
A micrograph of a copper foil cross section on a polyimide layer comprising the three copper layers shown in Example 1.

The cross section of the copper layer that was obtained as described above is shown in FIG. 2. The cross section of the copper layer is a result of performing chemical polishing of dipping the copper layer for 15 seconds in an aqueous solution of $NH_3$: 29%, $H_2O_2$: 1%.

In zone 3+zone 4, the copper layer was approximately two zones' worth, and the thickness of the copper layers formed in other zone 7+zone 8 has hardly any difference, so it is evident that a uniform layer was formed. Between Cell A and Cell B, that is, between zones 3+4 and zone 7, only a normal plating interface was observed, and no prominent boundary layer could be observed.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 120° C.×12 hours, and the cross section was observed. This cross section is similarly a result of performing chemical polishing of dipping the copper layer for 15 seconds in an aqueous solution of $NH_3$: 29%, $H_2O_2$: 1%. The results are shown in FIG. 3.

Figure 3:
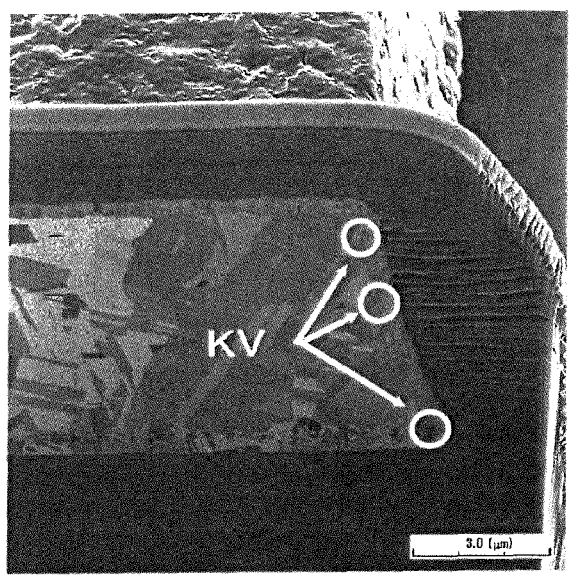
[FIG. 3]
A micrograph showing the cross section of a boundary obtained by forming a circuit by etching the three plated copper layers of Example 1, forming a tin plated layer on the copper circuit, and performing annealing after the tin plating.

As shown in FIG. 3, (two) small Kirkendall voids (KV) were confirmed at the boundary sections of the respective (three) layers. There were no Kirkendall voids right above the copper layer. It is evident that the present invention is far superior to the conventional technologies where the number of abundant Kirkendall voids that arise in the ten copper layers (at least at the interface of the ten layers) is very high.

Figure 12:
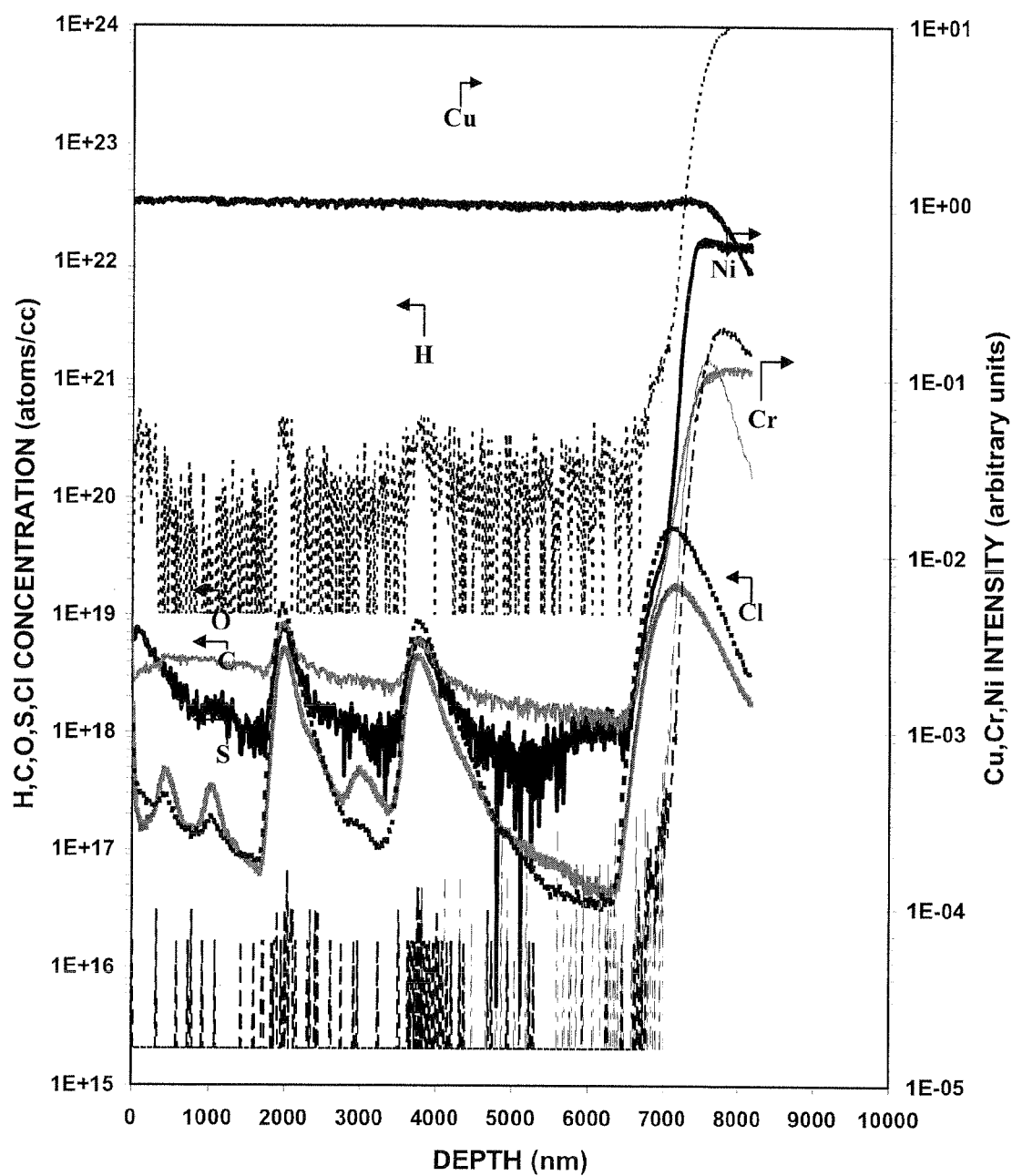

Here, upon observing the copper boundary section as the location where the Kirkendall voids were generated based on D-SIMS analysis, it was discovered that the additive components of C, O, S, Cl and H were concentrated. The results are shown in FIG. 12.

Figure 10:
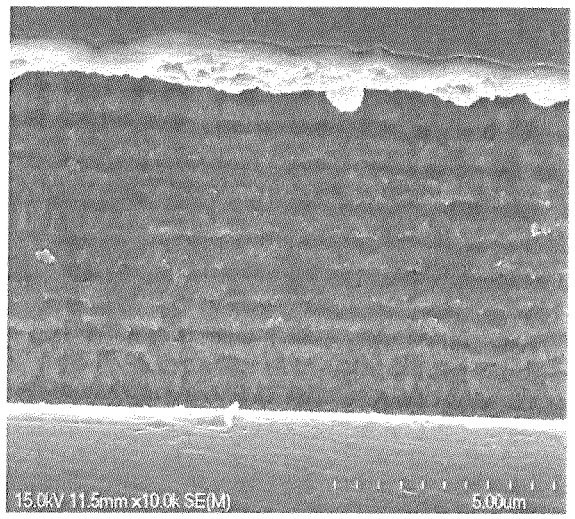

Two peaks of the concentrated portion of such impurities were observed in Example 1. As evident from FIG. 10, the location of the foregoing impurities coincided with the location where the Kirkendall voids were generated, and it is evident that the impurities promote the generation of Kirkendall voids.

The total amount of the respective impurities in the copper layer including the boundary section had also decreased, and it has been confirmed the reduction of the impurity content and the decrease in the generation of Kirkendall voids are related.

Accordingly, the reduction of impurities in the boundary section of the copper layer decreases the generation of Kirkendall voids, and consequently plays an important role in effectively inhibiting the peeling from the interface of the copper layer and the tin plating, and increasing the adhesion.

Example 2

Next, as with Example 1, the drum-based two bath-type electroplating apparatus shown in FIG. 1 was used to form the copper plated layer wherein, in order to reduce the number of zones, in Cell A, zone 3 and zone 4 were electrically connected, and the distance L between zone 3 and zone 4 was adjusted to be approximately ½ of the distance d between the anode and the plating object in order to form the copper plated layer; and, in Cell B, zone 7 and zone 8 were electrically connected, and the distance L between zone 7 and zone 8 was adjusted to be approximately ½ of the distance d between the anode and the plating object.

As a result of forming the copper layer, as described above, only a slight plated layer was formed in zone 1 and zone 2 of Cell A. Moreover, no plated layer was formed in zone 5 and zone 6 of Cell B. The results were the same as Example 1.

Consequently, the copper layer was mainly formed in zone 3, zone 4, and in zone 7+zone 8. The results are shown in Table 2. As shown in Table 2, a copper plated layer of 3.90 μm was formed in zone 3+zone 4, and that of 4.27 μm in zone 7+zone 8.

By way of reference, a copper plated layer of 0.05 μm was formed in zone 1, that of 0.27 μm in zone 2, and that of 0 μm in zone 5 and zone 6, respectively.

TABLE 2

| Zone | 1 | 2 | 3 + 4 | 5 | 6 | 7 + 8 |
|---|---|---|---|---|---|---|
| Thickness | 0.05 | 0.27 | 3.90 | 0.00 | 0.00 | 4.27 |

Thickness: Plating thickness (μm) per zone

Figure 4:
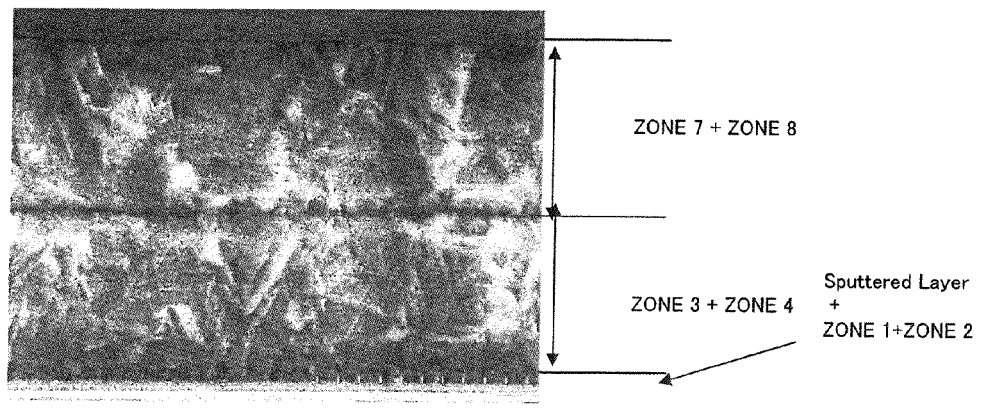
[FIG. 4]
A micrograph of the copper foil cross section on the polyimide layer comprising the two copper layers shown in Example 2.

The cross section of the copper layer obtained as described above is shown in FIG. 4, which is a result of performing chemical polishing of dipping the copper layer for 15 seconds in an aqueous solution of $NH_3$: 29%, $H_2O_2$: 1%.

In zone 3 +zone 4, the copper layer was approximately two zones' worth, and so was the thickness of the copper layers formed in other zone 7+zone 8, and the thickness of the copper layers has hardly any difference, so it is evident that a uniform layer was formed. Between Cell A and Cell B, that is, zones 3+4 and zone 7+8, only a normal plating interface was observed, and no prominent boundary layer could be observed.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 120° C.×12 hours, and the cross section was observed. This cross section is similarly a result of performing chemical polishing of dipping the copper layer for 15 seconds in an aqueous solution of $NH_3$: 29%, $H_2O_2$: 1%. The results are shown in FIG. 5.

Figure 5:
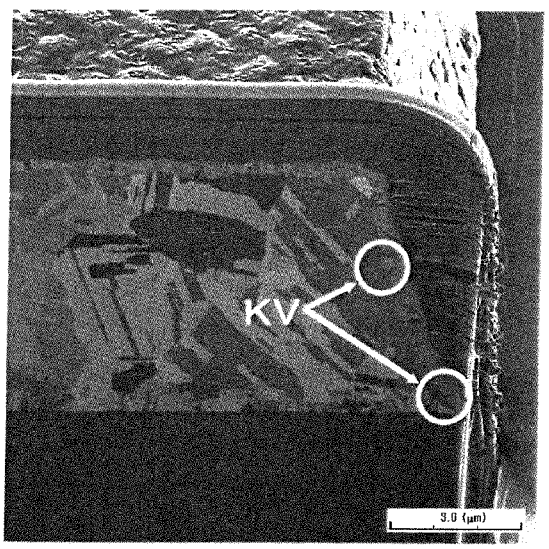
[FIG. 5]

As shown in FIG. 5, (one) small Kirkendall void (KV) was confirmed at the boundary section of the respective layers (two layers), and another (one) at the lower part (boundary section with the metal seed layer). There were no Kirkendall voids immediately above the copper layer.

It is evident that the present invention is far superior to the conventional technologies where the number of abundant Kirkendall voids that arise in the ten copper layers (at least at the interface of the ten layers) is considerably high. In addition, in comparison to Example 1, the number of Kirkendall voids was reduced even further since the discontinuous layer of the copper plated layer was reduced.

Figure 13:
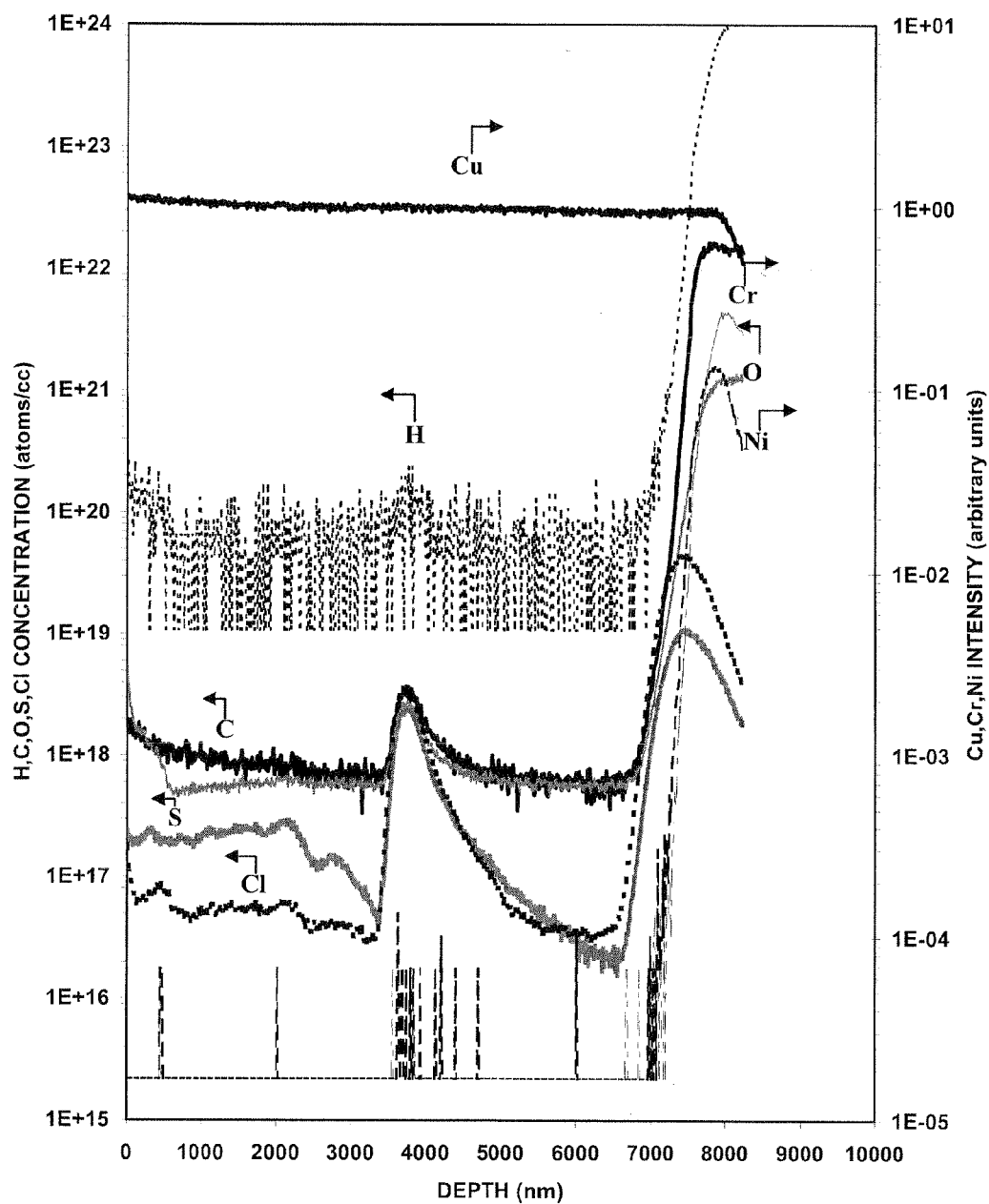

As with Example 1, the copper boundary section as the location where the Kirkendall voids were generated was observed based on D-SIMS analysis. Consequently, the additive components of C, O, S, Cl and H were concentrated. The results are shown in FIG. 13. One peak of the concentrated portion of such impurities was observed in Example 2. As evident from FIG. 13, the location of the foregoing impurities coincided with the location where the Kirkendall voids were generated, and it is evident that the impurities promote the generation of Kirkendall voids.

The total amount of the respective impurities in the copper layer including the boundary section had also decreased, and it has been confirmed that the reduction of the impurity content and the decrease in the generation of Kirkendall voids are related.

Accordingly, the reduction of impurities in the boundary section of the copper layer decreases the generation of Kirkendall voids, and consequently plays an important role in effectively inhibiting the peeling from the interface of the copper layer and the tin plating, and increasing the adhesion.

Example 3

Next, in addition to the plating conditions of Example 2, the copper plated layer was formed upon turning off the current of zone 1 and zone 2. In turning off the current of zone 1 and zone 2, dummy anodes prepared with an insulating material in the same shape was disposed in substitute of the normal anodes in zone 1 and zone 2.

As a result of forming the copper layer, in Cell A, a plated layer was not formed in zone 1 and zone 2. In addition, in Cell B also, a plated layer was not formed in zone 5 and zone 6.

Consequently, a copper layer was formed in zone 3+zone 4, and in zone 7+zone 8. The results are shown in Table 3. As shown in Table 3, a copper plated layer of 4.25 μm was formed in zone 3+zone 4, and that of 4.25 μm in zone 7+zone 8 as well. By way of reference, it was 0 μm in zone 1 and zone 2 and 0 μm in zone 5 and zone 6.

TABLE 3

| Zone | 1 | 2 | 3 + 4 | 5 | 6 | 7 + 8 |
|---|---|---|---|---|---|---|
| Thickness | 0.00 | 0.00 | 4.25 | 0.00 | 0.00 | 4.25 |

Thickness: Plating thickness (μm) per zone

Figure 6:
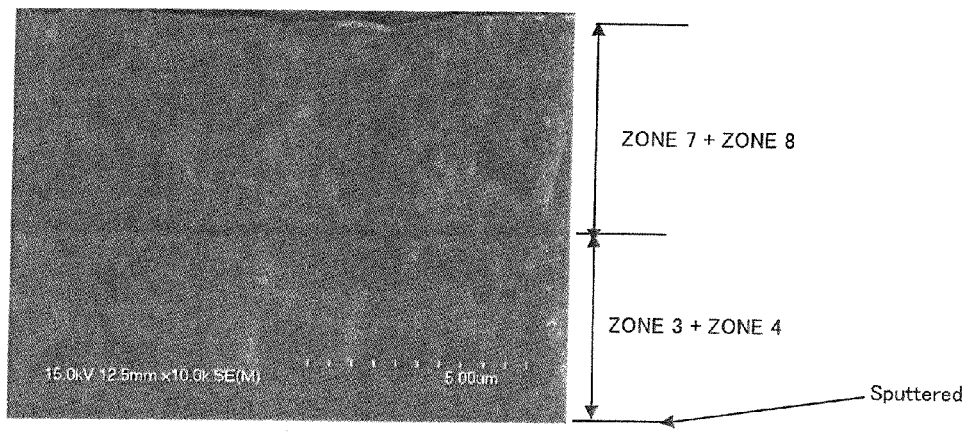

The cross section of the copper layer obtained as described above is shown in FIG. 6, which is a result of performing chemical polishing of dipping the copper layer for 15 seconds in an aqueous solution of $NH_3$: 29%, $H_2O_2$: 1%.

In zone 3+zone 4, the copper layer was approximately two zones' worth, and so was the thickness of the copper layers in other zone 7+zone 8, and the thickness of the copper layers has hardly any difference, so it is evident that a uniform layer was formed.

Between Cell A and Cell B, that is, zones 3+4 and zone 7+8, only a normal plating interface was observed, and no prominent boundary layer could be observed.

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 120° C.×12 hours, and the cross section was observed. This cross section is similarly a result of performing chemical polishing of dipping the copper layer for 15 seconds in an aqueous solution of $NH_3$: 29%, $H_2O_2$: 1%. The results are shown in FIG. 7.

Figure 7:
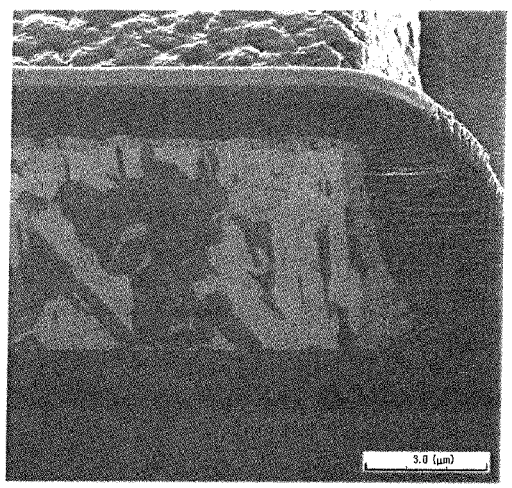

As shown in FIG. 7, no Kirkendall voids were observed at the boundary section of the respective layers (two layers), at the lower part (boundary section with the metal seed layer), or immediately above the copper layer. It is evident that the present invention is far superior to the conventional technologies where the number of abundant Kirkendall voids that arise in the ten copper layers (at least at the interface of the ten layers) is considerably high. In addition, in comparison to Example 2, the number of Kirkendall voids decreased even further since the discontinuous layer of the copper plated layer was reduced.

Figure 14:
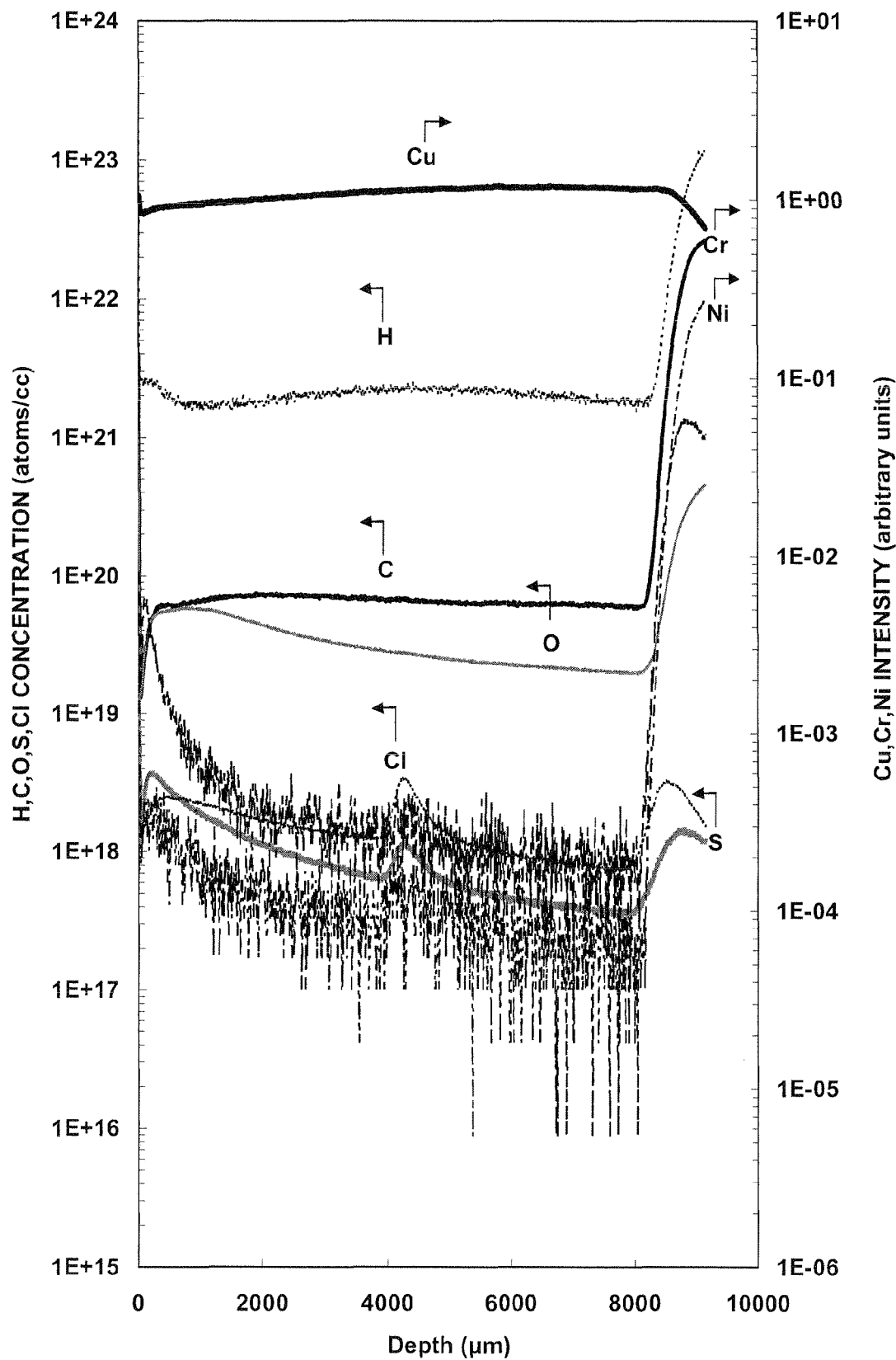

As in Example 1, the copper boundary section was observed based on D-SIMS analysis. Consequently, the additive components of C, O, S, Cl and H were concentrated. The results are shown in FIG. 14. The peak of the concentrated portion of such impurities was observed at the center portion but was slight in Example 3. In addition, the total amount of the respective impurities in the copper layer including the boundary section had also decreased, and it has been confirmed that the reduction of the impurity content and the decrease in the generation of Kirkendall voids are related.

Accordingly, the reduction of impurities in the boundary section of the copper layer decreases the generation of Kirkendall voids, and consequently plays an important role in effectively inhibiting the peeling from the interface of the copper layer and the tin plating, and increasing the adhesion.

Example 4

Next, a drum-based one bath-type electroplating apparatus was used and a copper plated layer was formed with only one cell and with only one zone in order to reduce the number of zones. Specifically, there is only one copper layer.

Thus, the copper layer was formed in one zone. The results are shown in Table 4. As shown in Table 4, a copper plated layer of 8.50 μm was formed in one zone.

Figure 8:
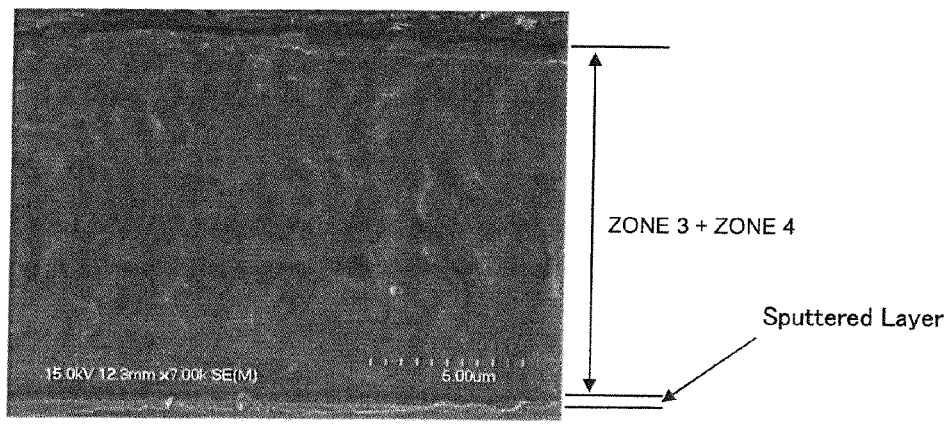

The cross section of the copper layer obtained as described above is shown in FIG. 8, which is a result of performing chemical polishing of dipping the copper layer for 15 seconds in an aqueous solution of $NH_3$: 29%, $H_2O_2$: 1%.

TABLE 4

| Zone | 1 | 2 | 3 + 4 | 5 | 6 | 7 | 8 |
|---|---|---|---|---|---|---|---|
| Thickness | 0.00 | 0.00 | 8.50 | 0.00 | 0.00 | 0.00 | 0.00 |

Thickness: Plating thickness (μm) per zone

Subsequently, this copper layer was etched to form a circuit, and a tin plated layer of approximately 0.3 μm was additionally formed on the copper circuit by dipping it into a tin plating bath of AT-501 manufactured by Nikko Mining & Metals at 50° C. for 3 minutes. After the foregoing tin plating, the copper layer was annealed at 125° C.×10.5 hours, and the cross section was observed.

This cross section is similarly a result of performing chemical polishing of dipping the copper layer for 15 seconds in an aqueous solution of $NH_3$: 29%, $H_2O_2$: 1%. The results are shown in FIG. 9.

Figure 9:
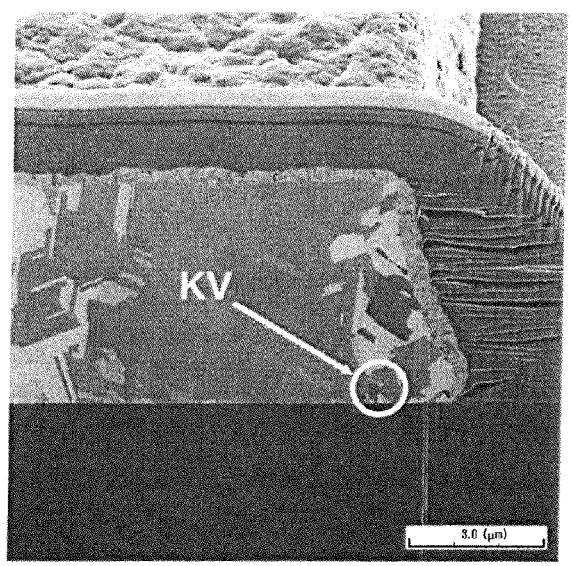

As shown in FIG. 9, only one small Kirkendall void (KV) was confirmed at the lower part (boundary section with the metal seed layer), and there were no Kirkendall voids immediately above the copper layer. It is evident that the present invention is far superior to the conventional technologies where the number of abundant Kirkendall voids that arise in the ten copper layers (at least at the interface of the ten layers) is considerably high. In addition, in comparison to Example 1, the number of Kirkendall voids was reduced even further since the discontinuous layer of the copper plated layer was reduced.

Figure 15:
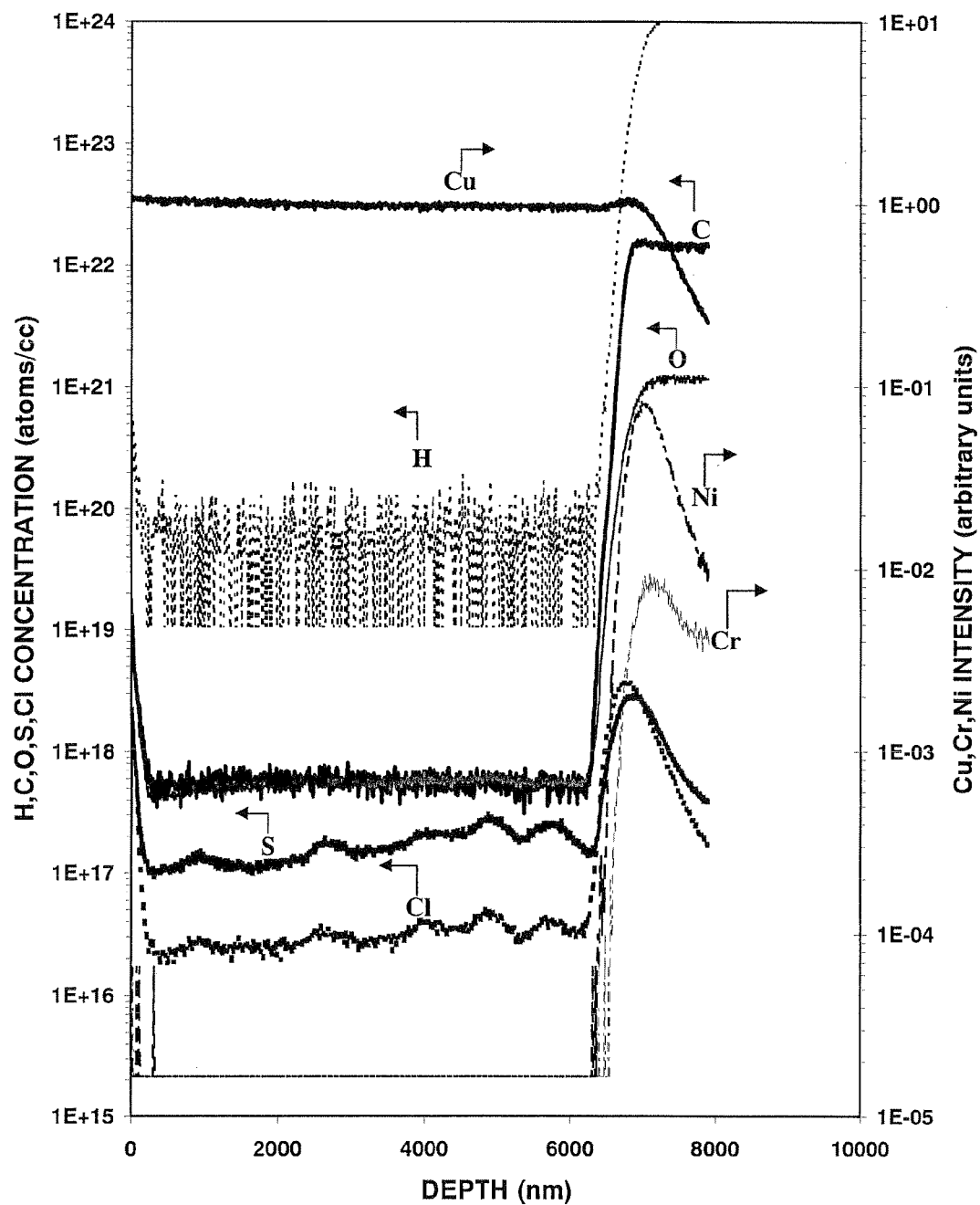

As with Example 1, the copper boundary section as the location where the Kirkendall voids were generated was observed based on D-SIMS analysis. Consequently, the additive components of C, O, S, Cl and H were concentrated. The results are shown in FIG. 15. Not a single peak of the concentrated portion of such impurities was observed in Example 4. In addition, the total amount of the respective impurities in the copper layer including the boundary section had also decreased, and it has been confirmed that the reduction of the impurity content and the decrease in the generation of Kirkendall voids are related.

Accordingly, the reduction of impurities in the boundary section of the copper layer decreases the generation of Kirkendall voids, and consequently plays an important role in effectively inhibiting the peeling from the interface of the copper layer and the tin plating, and increasing the adhesion.

Comparative Example 1

Next, a polyimide film was continuously introduced into conventional ten copper plating baths, and ten copper layers were formed on the surface of the polyimide film in zigzag. As with Example 1, the observation of the Kirkendall voids are shown. In the foregoing case, the average thickness of one layer was approximately 0.5 μm, and a copper layer of approximately 50 μm was formed as the ten copper plated layers.

The cross section of the copper layer obtained as described above is shown in FIG. 10, which is a result of performing chemical polishing of dipping the copper layer for 15 seconds in an aqueous solution of $NH_3$: 29%, $H_2O_2$: 1%. The other conditions were the same as Example 1.

Subsequently, this copper layer was etched to form a circuit, and a tin plated layer of approximately 0.3 μm was additionally formed on the copper circuit by dipping it into tin plating bath of AT-501 manufactured by Nikko Mining & Metals at 50° C. for 3 minutes. After the foregoing tin plating, the copper layer was annealed at 125° C.×10.5 hours, and the cross section was observed. This cross section is similarly a result of performing chemical polishing of dipping the copper layer for 15 seconds in an aqueous solution of $NH_3$: 29%, $H_2O_2$: 1%. The results are shown in FIG. 11.

Figure 11:
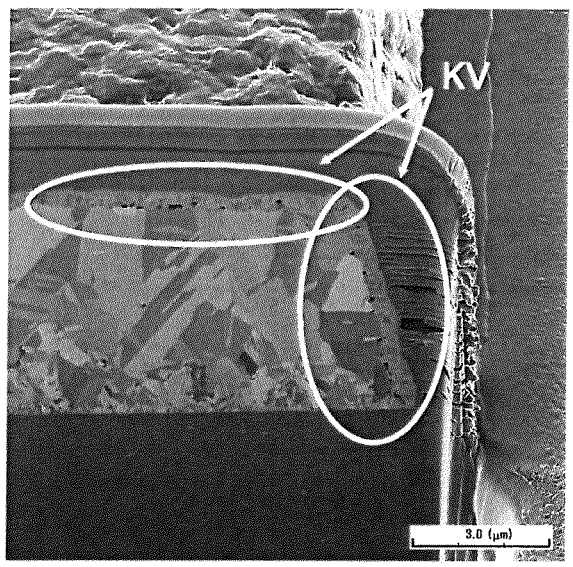

As shown in FIG. 11, numerous small Kirkendall voids (KV) were confirmed at the upper layer surface of the copper foil and at the interface of each of said layers.

Thus, the number of abundant Kirkendall voids that arise in the ten copper layers (at least at the interface of the ten layers) is so high that peeling occurred between the copper layer and the tin plated layer.

As with Example 1, the copper boundary section where the Kirkendall voids were generated was observed based on D-SIMS analysis. Consequently, the additive components of C, O, S, Cl and H were concentrated between the ten or more copper layers. The results are shown in FIG. 16.

Figure 16:
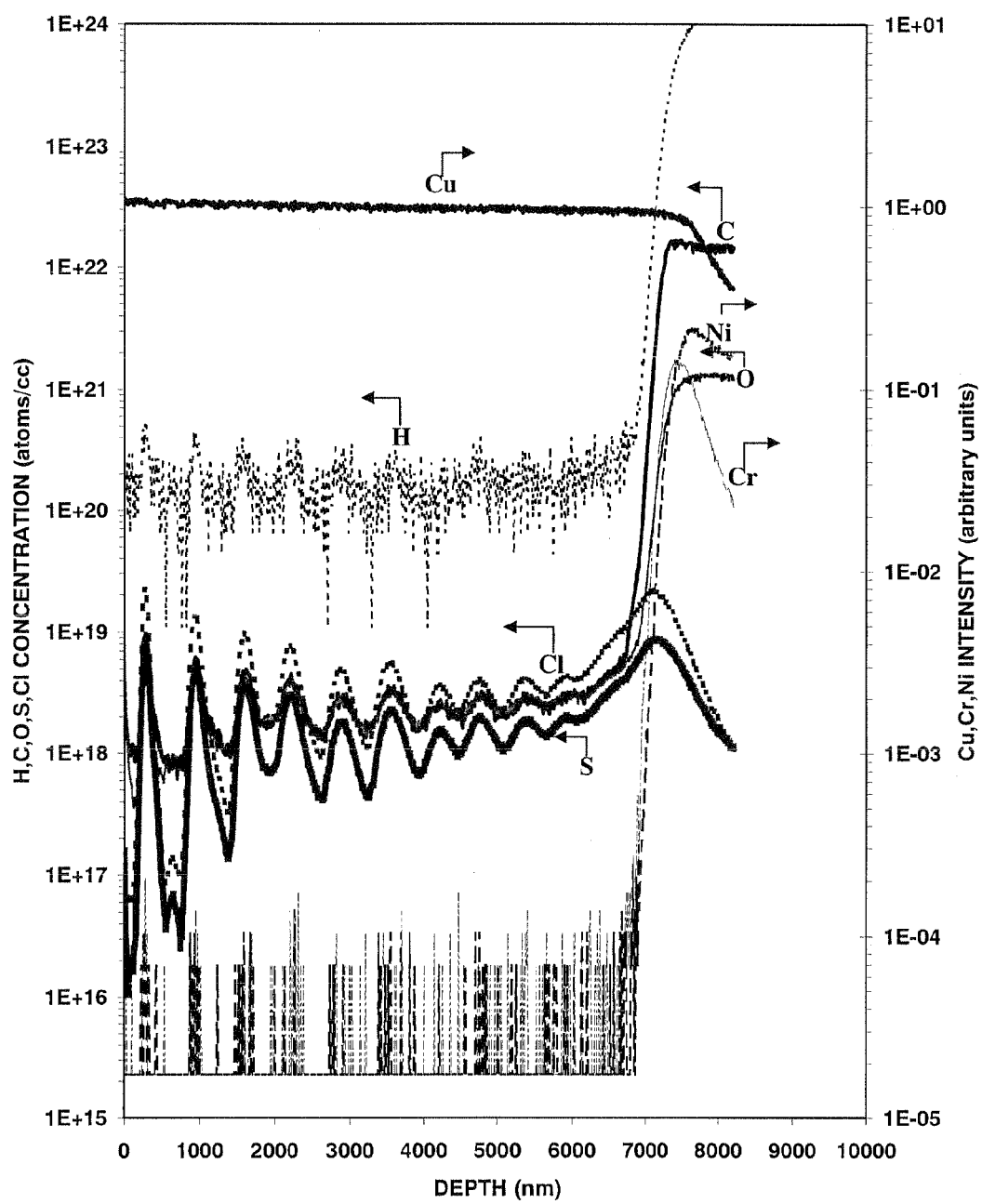

With respect to the peak of the concentrated portion of such impurities, as evident from FIG. 16, the location of the foregoing impurities coincided with the location where the Kirkendall voids were generated, and it is evident that the impurities promote the generation of Kirkendall voids.

The total amount of the respective impurities in the copper layer including the boundary section had also increased considerably, and it is evident that the increase of impurities in the boundary section of the copper layer increases the generation of Kirkendall voids, and also increases the impurity content in the overall copper layer. Consequently, it is evident that the increase of impurities causes the peeling from the interface of the copper layer and tin plating, and deteriorates adhesion.

The metal covered polyimide composite, method of producing the composite and apparatus for producing the electronic circuit board of the present invention can effectively prevent peeling in a non-adhesive flexible laminate (especially a two-layer flexible laminate), particularly can effectively inhibit peeling from the interface of a copper layer and tin plating, and yield a superior effect of improving the adhesion strength. Thus, the present invention is useful as a non-adhesive flexible laminate that is used as a mounting material of electronic components such as a flexible print substrate, TAB and COF.

The invention claimed is:

1. A metal covered polyimide composite obtained by feeding around one or two plating drums in one or two plating baths a polyimide film comprising a tie-coat layer and a metal seed layer formed on a surface of a polyimide film by electroless plating or a dry method, and a copper layer or a copper alloy layer directly formed on the metal seed layer by electroplating in the one or two plating baths, wherein the copper layer or copper alloy layer consists of two or three separately-applied plating layers of copper or copper alloy with a boundary being formed and located between each adjacent pair of the separately-applied plating layers, including a concentrated portion of impurities at the boundary or boundaries, wherein each of said two or three separately-applied plating layers of copper or copper alloy has a thickness within a range of 2.07 μm to 8.50 μm without a boundary containing concentrated impurities extending therein, and wherein no further layers of copper or copper alloy are plated on said two or three separately-applied plating layers of copper or copper alloy of the metal covered polyimide composite.

2. The metal covered polyimide composite according to claim 1, wherein the tie-coat layer is made of a metal or an alloy selected from the group consisting of nickel, chromium, cobalt, nickel alloy, chromium alloy, and cobalt alloy, and the metal seed layer is made of copper or copper alloy.

3. The metal covered polyimide composite according to claim 2, wherein said copper layer or copper alloy layer consists of two separately-applied plating layers and a single boundary between said two separately applied plating layers, and wherein the thickness of each of said two separately-applied plating layers is within a range of 3.90 μm to 4.27 μm.

4. The metal covered polyimide composite according to claim 2, wherein said copper layer or copper alloy layer consists of three separately-applied plating layers and two boundaries, and wherein the thickness of each of said three separately-applied plating layers is within a range of 2.07 μm to 3.90 μm.

5. The metal covered polyimide composite according to claim 1, wherein the thickness of each of said two or three separately-applied plating layers is within a range of 2.07 μm to 4.27 μm.

6. A method of producing an electronic circuit board, wherein, after forming a copper circuit or copper alloy circuit by way of etching the metal covered polyimide composite according to claim 1, tin plating to the copper circuit or copper alloy circuit is performed.

7. A metal covered polyimide composite, comprising:
a polyimide film;
a tie-coat layer formed on a surface of said polyimide film;
a metal seed layer formed on said tie-coat layer; and
a copper or copper alloy layer directly formed on said metal seed layer by electroplating, said copper or copper alloy layer consisting of two or three separately-applied plating layers with a boundary only being formed and located between each adjacent pair of plating layers and a concentrated portion of impurities being present only within the boundary between each adjacent pair of plating layers and not within the two or three separately-applied plating layers;
each of said two or three separately-applied plating layers having a thickness within a range of 2.07 μm to 8.50 μm; and
no further layers of copper or copper alloy are plated on said two or three separately-applied plating layers of copper or copper alloy of the metal covered polyimide composite.

8. The metal covered polyimide composite according to claim 7, wherein said tie-coat layer is made from a metal selected from the group consisting of nickel, chromium, cobalt, nickel alloy, chromium alloy, and cobalt alloy, and wherein said metal seed layer is made from copper or copper alloy.

9. The metal covered polyimide composite according to claim 8, wherein said copper or copper alloy layer is in the form of a circuit, and wherein a layer of tin is plated thereon.

10. The metal covered polyimide composite according to claim 8, wherein said copper or copper alloy layer consists of two separately-applied plating layers and a single boundary between said two separately-applied plating layers.

11. The metal covered polyimide composite according to claim 10, wherein the thickness of each of said two separately-applied plating layers is within a range of 3.90 μm to 4.27 μm.

12. The metal covered polyimide composite according to claim 8, wherein said copper or copper alloy layer consists of three separately-applied plating layers and a total of two boundaries.

13. The metal covered polyimide composite according to claim 12, wherein the thickness of each of said three separately-applied plating layers is within a range of 2.07 μm to 3.90 μm.

14. The metal covered polyimide composite according to claim 7, wherein the thickness of each of said two or three separately-applied plating layers is within a range of 2.07 μm to 4.27 μm.

15. A method of producing a metal covered polyimide composite, wherein after forming a tie-coat layer and a metal seed layer on a surface of a polyimide film by electroless plating or a dry method, and further feeding the polyimide film around a plating drum, only two or three separately-applied layers of electroplated copper or copper alloy are formed on the metal seed layer with a boundary being formed between each adjacent pair of the two or three layers of electroplated copper or copper alloy, wherein formed from the two or three layers of electroplated copper or copper alloy is a copper layer or copper alloy layer including a concentrated portion of impurities at the boundary between each adjacent pair of the two or three layers of electroplated copper or copper alloy, wherein the two or three layers of electroplated copper or copper alloy are formed by dividing an electroplating zone into two to four zones when feeding the polyimide film with the tie-coat layer and metal seed layer formed thereon around the plating drum and performing electroplating thereto, and wherein a gap between at least two adjacent ones of the zones is equal to or less than half the distance between anodes of the at least two adjacent ones of the zones and the polyimide film traveling on the plating drum.

16. The method according to claim 15, further comprising the steps of:
etching the copper layer or copper alloy layer to form a copper or copper alloy circuit; and
plating the copper or copper alloy circuit with a layer of tin.

17. A method of producing a metal-covered polyimide composite, comprising the steps of:
- forming a tie-coat layer on a surface of a polyimide film and a metal seed layer on the tie-coat layer; and
- feeding the polyimide film with the tie-coat layer and the metal seed layer around a plating drum within an electroplating bath to electroplate two or three plating layers of copper or copper alloy on the metal seed layer such that a boundary containing concentrated impurities is formed between each adjacent pair of the two or three plating layers of copper or copper alloy;
- wherein the electroplating bath has an electroplating area divided into a plurality of electroplating zones, a pre-determined one of the plurality of electroplating zones consisting of two adjacent anode plates which are electrically connected and which have a gap formed therebetween equal to or less than half a distance between surfaces of the two adjacent anode plates facing the plating drum and the polyimide film traveling on the plating drum; and
- wherein one of the two or three plating layers of copper or copper alloy being formed in the pre-determined one of the plurality of electroplating zones.

18. A method of producing a metal-covered polyimide composite, comprising the steps of:
- forming a tie-coat layer on a surface of a polyimide film and a metal seed layer on the tie-coat layer; and
- feeding the polyimide film with the tie-coat layer and the metal seed layer around a first plating drum within a first electroplating bath and a second plating drum within a second electroplating bath to electroplate two or three plating layers of copper or copper alloy on the metal seed layer such that a boundary containing concentrated impurities is formed between each adjacent pair of the two or three plating layers of copper or copper alloy;
- wherein the first electroplating bath includes an electroplating zone consisting of two adjacent anode plates which are electrically connected and which have a gap formed therebetween equal to or less than half a distance between surfaces of the two adjacent anode plates facing the first plating drum and the polyimide film traveling on the first plating drum;
- wherein the second electroplating bath includes an electroplating zone consisting of two adjacent anode plates which are electrically connected and which have a gap formed therebetween equal to or less than half a distance between surfaces of the two adjacent anode plates facing the second plating drum and the polyimide film traveling on the second plating drum; and
- wherein one of the two or three plating layers of copper or copper alloy is formed in the electroplating zone of the first electroplating bath and another one of the two or three plating layers of copper or copper alloy is formed in the electroplating zone of the second electroplating bath.

* * * * *